United States Patent [19]

Prickett, Jr.

[11] Patent Number: 5,513,147
[45] Date of Patent: Apr. 30, 1996

[54] ROW DRIVING CIRCUIT FOR MEMORY DEVICES

[75] Inventor: Bruce L. Prickett, Jr., Fremont, Calif.

[73] Assignee: Alliance Semiconductor Corporation, San Jose, Calif.

[21] Appl. No.: 359,052

[22] Filed: Dec. 19, 1994

[51] Int. Cl.⁶ .................................................. G11C 8/00
[52] U.S. Cl. ................ 365/230.06; 365/185.23; 365/189.11
[58] Field of Search ............. 365/189.09, 189.11, 365/185, 230.06, 185.23

[56] References Cited

U.S. PATENT DOCUMENTS

| | | | |
|---|---|---|---|
| 4,823,318 | 4/1989 | D'Arrigo et al. | 365/185.23 |
| 5,077,691 | 12/1994 | Haddad et al. | 365/218 |

*Primary Examiner*—Joseph A. Popek
*Attorney, Agent, or Firm*—Bradley T. Sako

[57] ABSTRACT

A row driving circuit (10) having a reduced number of transistors provides range of row deselect voltages, and eliminates the need for an NMOS pull-down device. The row driving circuit (10) has a-level shifter (14) formed by a PMOS input pull transistor P1 that is drain coupled at node V 10 to an NMOS input transistor N1. N1 functions as passgate for a row select signal and inverted row select signal applied to its gate and source respectively. A PMOS row pull-up transistor P2 has its gate coupled to V 10, its source coupled to a variable positive supply voltage (12), and its drain coupled to the source of a PMOS row select transistor P3. The drain and gate of P3 are coupled to switching circuits S 11 and S 12 respectively. S 11 and S 12 provide gate and drain voltages to quickly deselect the row by pulling the row to a negative deselect voltage. A PMOS erase transistor is also source coupled to the row with its gate coupled to switching circuit S 13 and its drain coupled to switching circuit S14. S13 and S14 provide a negative erase voltage to both the gate and drain of P4. In addition, S13 and S 14 can bias P4 into linear mode, allowing P4 to operate a leaker transistor, pulling the row down to a deselect voltage.

18 Claims, 3 Drawing Sheets

ROW DRIVING CIRCUIT FOR MEMORY DEVICES

TECHNICAL FIELD

The present invention relates generally to memory circuits, and more particularly to row driving circuits for reading, programming, and erasing flash EPROM cells within a selected row of a flash EPROM circuit.

BACKGROUND OF THE INVENTION

Non-volatile electrically erasable integrated circuit memory devices can be categorized as EEPROMs and as "flash" EPROMs (also called flash EEPROMs). EEPROMs utilize the well-known Fowler-Nordheim tunneling mechanism for both programming and erasing. Flash EPROMs, on the other hand, utilize hot electron injection for programming and Fowler-Nordheim tunneling for erasing.

Flash memory devices are typically composed of one or more arrays of single transistor flash EPROM cells. Each cell includes a source, a drain, a control gate, and a floating gate. Through a series of rows and columns, each flash cell can be erased, programmed, or read.

In order to operate at high speeds, a flash memory device places certain demands on row driving circuits. For example, during a read operation the row driving circuit must be capable of driving the row between +0 volts and +5 volts in only a few nanoseconds. The same row driving circuits must also be capable of driving the row to +12 volts or −12 volts in only a matter of microseconds during program and erase. Thus, the row driving circuit speed is an essential aspect of flash EPROM operation.

Large, high-speed flash memories also exact a toll on cell capacity. In order to accomplish high speed operation in flash memories, complex column and row decoding and driving circuits are often required, which can occupy valuable area on the integrated circuit, reducing the potential number of cells in the array. Any reduction in the number of driving circuit devices provides more area for additional flash cells, or a more compact integrated circuit. Such a reduction can also simplify the fabrication process.

A row driving circuit for a flash EPROM is set forth in U.S. Pat. No. 5,077,691, issued to Haddad et al. on Dec. 31, 1991. The row driving circuit is reproduced in detail herein, as FIG. 1. The prior art row driving circuit is designed to operate in three modes; a READ mode, a PROGRAM mode, and an ERASE mode. In the READ mode a selected row is driven to +5 volts while a deselected row is driven to ~0 volts. Similarly, in the PROGRAM mode, a row is selected and driven to +12 volts while deselected rows are driven to ~0V. In the ERASE mode, all rows are normally driven to −12 volts, while a small number of rows may be disabled from ERASE by being driven to +5 volts. The operating conditions of the prior art circuit are set forth below in Table I below.

TABLE I

| MODE | XIN | X | S1 | S2 | S3 |
|---|---|---|---|---|---|
| Read Select | ~0 V | +5 V | +5 V | ~0 V | −2 V |
| Read Disable | +5/~0 V | +5/~0 V | +5 V | ~0 V | −2 V |
| Program Select | ~0 V | +5 V | +12 V | +5 V | −2 V |
| Program Disable | +5/~0 V | +5/~0 V | +12 V | +5 V | −2 V |
| Erase Select | +5 V | +5 V | +5 V | ~0 V | 5 V |
| Erase Disable | ~0 V | +5 V | +5 V | ~0 V | 5 V |

TABLE I-continued

| MODE | S4 | V1 | V2 | V3 |
|---|---|---|---|---|
| Read Select | +5 V | ~0 V | +5 V | +5 V |
| Read Disable | +5 V | +5 V | ~0 V | ~0 V |
| Program Select | float | ~0 V | +12 V | +12 V |
| Program Disable | float | +12 V | ~0 V | ~0 V |
| Erase Select | −13 V | +5 V | —12 V | ~0 V |
| Erase Disable | −13 V | ~0 V | +5 V | float |

As set forth in FIG. 1, the prior art row driving circuit includes a NMOS input transistor that acts as a passgate upon the application of a decode signal X and inverted decode signal XIN. The drain of the NMOS input transistor is connected to node V1 which includes the drain of a PMOS input pull-up transistor, the gate of a PMOS row pull-up transistor, and the gate of an NMOS row pull-down transistor. The sources of both PMOS pull-up transistors are connected to a positive supply voltage via S1. Depending on the mode, as set forth in Table 1 above, S1 is alternatively at +5 volts or +12 volts. The gate of the input pull-up PMOS transistor is switched between different bias voltages by S2, also according to the mode. One skilled in the art would recognize that combination of the NMOS input transistor and PMOS input pull-up transistor, along with the decoder signals X and XIN, act as a level shifter. When a row is selected, the NMOS input transistor sinks more current than the PMOS input pull-up transistor can source, pulling node V1 low. If the input is not sinking current, the PMOS input pull-up transistor is biased to pull node V1 to the voltage at S1.

As set forth in FIG. 1, the row (set forth as node V2) is driven by the PMOS row pull-up transistor and the NMOS row pull-down transistor which operate as a CMOS inverter. When V1 is at ~0 volts, the NMOS row pull-down transistor is cut off, and the PMOS row pull-up transistor pulls the row (V2), up to the voltage of S1. This "selects" the row for reading and for programming. When V1 is pulled up to the same voltage as S1 by the level shifter, the PMOS row pull-up transistor is cut-off, and the NMOS row pull down transistor pulls the row down to ~0 volts. This deselects the row during reading and programming.

Interposed between the transistors of the inverter formed by row pull-up and pull-down transistors is a PMOS isolation transistor. The PMOS isolation transistor is positioned between the drain of the NMOS row pull-down transistor and the row. In the READ and PROGRAM modes, the gate of the isolation PMOS transistor receives the voltage determined by S3. As set forth in Table I, in the READ and PROGRAM modes, the gate of the PMOS isolation transistor is at −2 volts which ensures the transistor is on, allowing the row to be pulled to 0 volts. In contrast, in the ERASE mode, S3 is set to +5 volts, isolating the NMOS row pull-down transistor from the row as is reflected at node V3. The isolation function is necessary because if the drain of the NMOS pull-down transistor was directly connected to V2, the P-N junction formed by its drain and the p-type substrate would be forward biased when the row was pulled any lower than ~0.6 volts below ground.

As set forth in FIG. 1 and Table I, the negative erasing voltage is provided to the row by a PMOS erase transistor having its source connected to V2 and both its drain and gate connected to S4 which provides a voltage according to operation mode. This includes the negative erase voltage during the ERASE mode.

All the PMOS devices, including the PMOS erase transistor share the same n-well, which follows S1. This arrangement ensures that the P-N junctions formed by the source of the PMOS erase transistor and its n-well do not become forward biased when the row is driven above +5 volts during PROGRAM mode. As shown in Table I, S4 remains floating during the PROGRAM mode, drawing no dc current. In the READ mode S4 is held at +5 volts, which leaves the PMOS erase transistor cut-off. In ERASE mode S4 is driven to –13 volts. At the same time, S3 and node V1 are at +5 volts, cutting off both the PMOS isolation transistor and the PMOS row pull-up transistor. This allows the row to be pulled down to ~–12 volts by the PMOS erase transistor in the ERASE mode.

In a typical ERASE procedure, the erase voltage (~–12 volts) is applied to a block of rows (a sector), requiring that all of the row drivers be enabled "low" together. This is accomplished by driving all of the X signals to ~0 volts. Alternatively, all the X signals can be driven high, and the XIN signals can also all be driven high. With all X signals high, a block of rows decoded by a single XIN signal can be disabled from ERASE by driving the XIN signal low. This will disable the ERASE for those rows by holding them at +5 volts with the PMOS row pull-up transistor pulling up against the load of the PMOS erase transistor.

As mentioned previously, it is always desirable to free up area on an integrated circuit. Because the PMOS isolation transistor takes up area and serves no function other than isolation, it would be desirable to arrive at a row driving circuit that could eliminate this device. While other prior art methods have eliminated the device, it has been by utilizing a triple well process, which adds to process complexity.

In layout, the row driving circuit of Haddad et al. requires that the V1 node be connected to both gates of the row driving circuit, the NMOS pull down transistor and the PMOS pull-up transistor. The same o requirement applies to the common drain connection between the NMOS row pull-down transistor and the PMOS isolation transistor. As a result, two speed critical signals must run in the pitch of one row. Because such a constraint is particularly difficult to overcome if the manufacturing process does not use a second layer metal for interconnect, it would be desirable to eliminate this requirement.

As illustrated in FIG. 1, the lowest voltage to which the NMOS row pull-down transistor can pull a deselected row is ~0 volts (the p-type substrate voltage). This forces a minimum erase threshold for each flash cell for a given READ operation. To provide for lower erase thresholds, it would be desirable to force the deselected rows to a lower voltage than the prior art.

It is also noted that in the Haddad et al. design, the PMOS input pull-up transistor typically has a small width-to-length (W/L) ratio relative to the NMOS input transistor, as it presents a de load which must be overpowered by the NMOS input transistor. Similarly, the PMOS erase transistor must be weak relative to the PMOS row pull-up transistor to allow the erase transistor to be overpowered by the row pull-up transistor. It would be desirable to overcome this limitation to allow for more flexibility in layout of a row driving circuit.

To the inventor's knowledge, no prior art row driving circuit is easily adaptable to single metal interconnect process, provides for lower deselect row voltages during READ operation, or allows for greater flexibility in transistor size.

SUMMARY OF THE INVENTION

Accordingly, it is an object of the present invention to provide a row driving circuit that eliminates the need for an NMOS row pull-down transistor.

It is another object of the present invention to provide a row driving circuit having a smaller number of devices.

It is yet another object of the present invention to provide a row driving circuit that reduces row pitch.

It is still another object of the present invention to provide a row driving circuit that provides for greater flexibility in transistor size.

It is yet another object of the present invention to provide a row driving circuit for flash EPROMs that is more adaptable to single metal interconnect manufacturing processes. It is still another object of the present invention to provide a row driving circuit for flash EPROMs that allows for lower erase thresholds in EPROM cells for READ operations.

Briefly, the preferred embodiment of the present invention is a flash EPROM row driving circuit for driving a row during READ, PROGRAM, and ERASE operations. The preferred embodiment has an input level shifter for receiving a decode signal and inverted decode signal. The level shifter includes a PMOS input pull-up transistor that is current limited by its gate being referenced to a supply voltage. The output of the level shifter is coupled to the gate of a PMOS row pull-up transistor having a source connected to the supply voltage and a drain connected to a row. A PMOS read deselect transistor and PMOS erase transistor are connected by their sources to the row as well. The PMOS read deselect transistor is cut off during PROGRAM and ERASE operations, but during READ operations, pulls deselected rows to a negative read deselect voltage. The PMOS erase transistor pulls the row down to a large negative erase voltage during ERASE operations. During the READ and PROGRAM operations, the PMOS erase transistor operates as a leaker transistor to help maintain the row at the read deselect voltage (–2 volts) and program deselect voltage (~0 volts), respectively.

An advantage of the present invention is that it provides a row driving circuit with a leaker transistor to assist in maintaining the row at deselect voltages during READ and PROGRAM operations.

Yet another advantage of the present invention is that it provides a row driving circuit with a level shifter having transistors of reduced channel length.

A further advantage of the present invention is that is provides a row driving circuit that can pull down a row to a deselected state during address transitions.

Still another advantage of the present invention is that it provides a row driving that can pull down a deselected row to a variety of different deselect voltages.

These and other objects and advantages of the present invention will become clear to those skilled in the art in view of the description of the best presently known modes of carrying out the invention, and the industrial applicability of the preferred embodiments as described herein and as illustrated in the several figures of the drawings.

DETAILED DESCRIPTION OF THE PREFERRED EMBODIMENT

Figure 1:
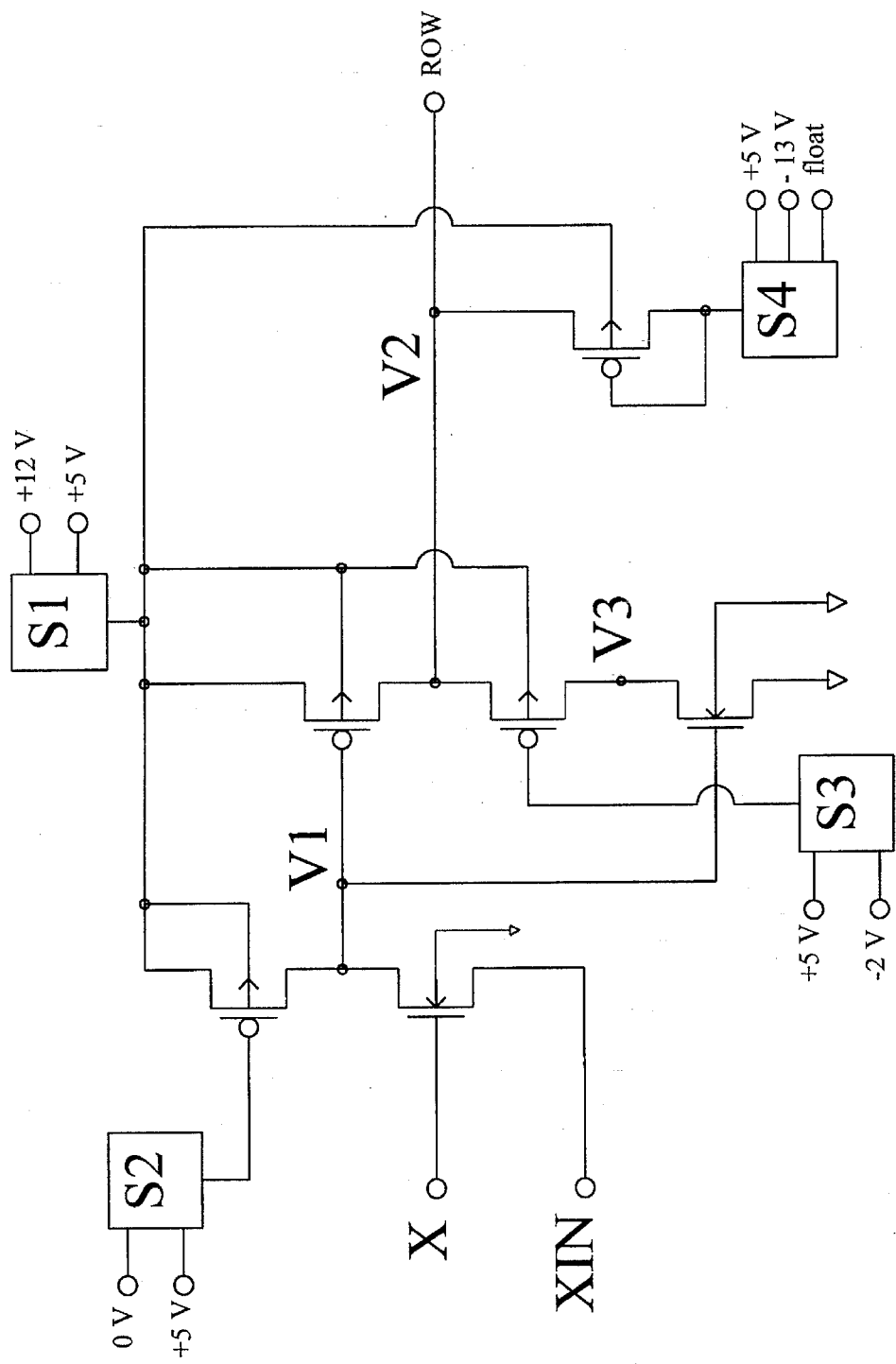
FIG. 1 is a schematic diagram illustrating a conventional row driving circuit.
Figure 2:
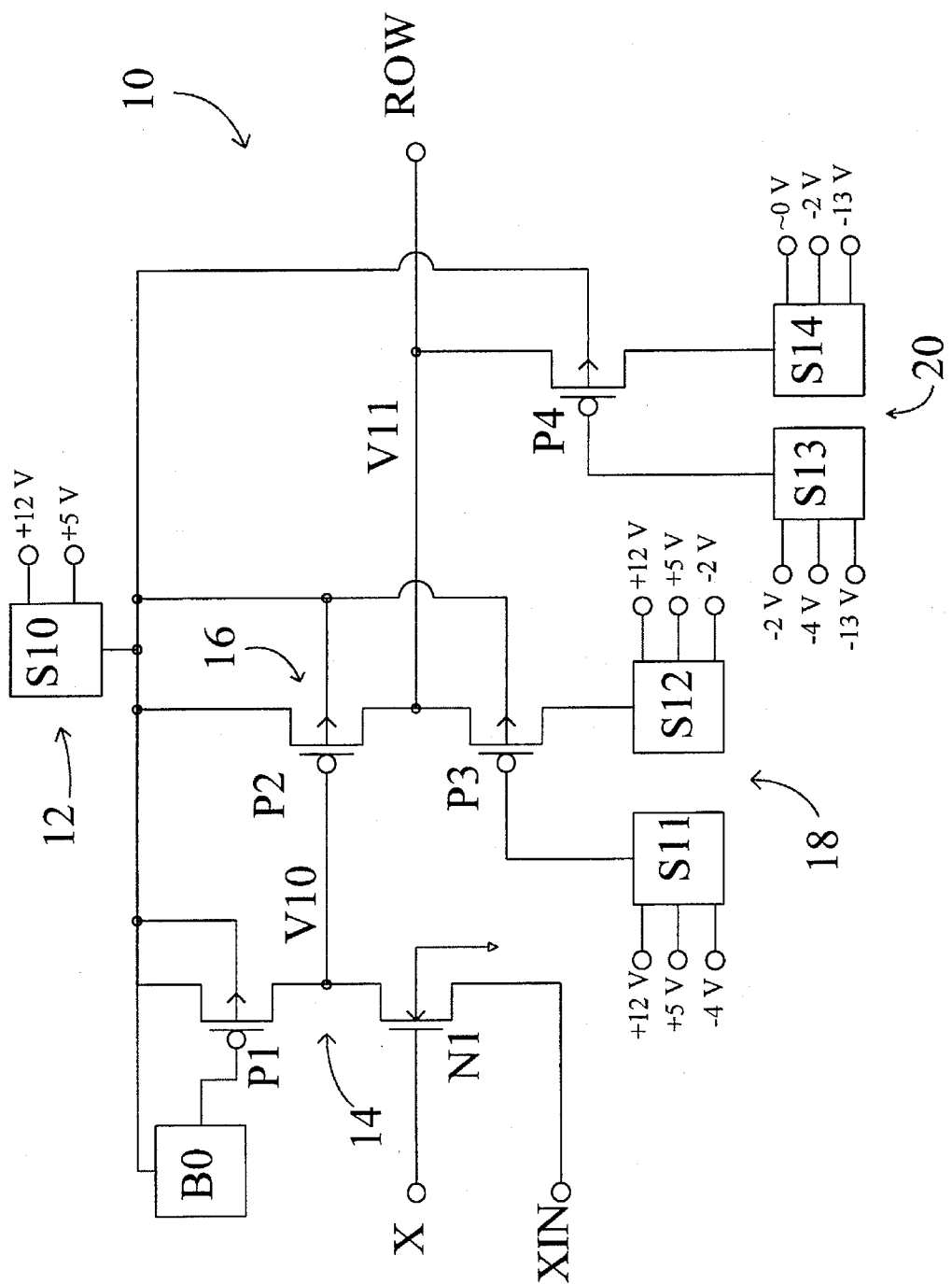
FIG. 2 is a schematic diagram illustrating the preferred embodiment of the present invention.

The preferred embodiment of the present invention is a row driving circuit for flash EPROMs and is set forth in detail schematic detail in FIG. 2, and designated by the general reference character 10. The row driving circuit 10 is designed to provide the necessary voltages according to operating mode. As set forth in the figure the circuit 10 includes a positive supply voltage 12, a level shifter 14, a row driver subcircuit 16, a row deselect subcircuit 18 and an erase/leaker subcircuit 20.

In the preferred embodiment 10, the level shifter 14 includes a PMOS input pull-up transistor P1, an NMOS input transistor N1, and a bias circuit B0 that is referenced to the positive supply voltage 12. As shown in FIG. 2, the gate of N1 receives a decode signal X and the source receives an inverted decode signal XIN. The drain of N 1 is coupled to the drain of P1 at the node designated as V10. The gate of P1 receives a s voltage determined by the bias circuit, B0, and the source of P1 is connected to the positive supply voltage 12, determined by switching circuit S10. The various voltage levels of B0 and S10, according to the operational mode (READ, PROGRAM, or ERASE), will be set forth in detail at a later point herein.

As shown in FIG. 2, node V10 is also connected to the gate of a PMOS row pull-up transistor P2 which is connected by its drain to a row, designated as the node V11. The source of P2, like the source of P1, is connected to S 10.

In the preferred embodiment 10, a PMOS read deselect transistor P3 and a PMOS erase transistor P4 are connected to the row by their respective sources. The gate of P3 is connected to a second switching circuit S11 which provides a number of bias voltages according to the operation mode. In a similar manner, the drain of P3 is connected to a third switching circuit S21 which also provides a number of voltages according to operational mode.

As shown in FIG. 2, the gate of P4 is connected to a fourth switching circuit S13, while its drain is connected to a fifth switching circuit S14. The various voltages provided by the switching circuits S10-S14 will be discussed in detail below.

It is noted that in the preferred embodiment 10, the body of every PMOS device, an n-well, is connected to S10. This arrangement prevents any possible forward biasing of MOS P-N junctions as the row driving circuit 10 operates in different modes, as will be set forth below.

Having described the various components of the preferred embodiment 10, the operation of the row driving circuit 10 will be discussed. To aid in understanding the preferred embodiment 10, the various operating voltages for the various modes are set forth in Table II below.

TABLE II

| MODE | XIN | X | S10 | B0 | S11 |
|---|---|---|---|---|---|
| Read Select | ~0 V | +5 V | +5 V | ~+2 V | +5 V |
| Read Disable | +5/~0 V | +5/~0 V | +5 V | ~+2 V | +5/~4 V |
| Program Select | ~0 V | +5 V | +12 V | ~+10 V | +12 V |
| Program Disable | +5/~0 V | +5/~0 V | +12 V | ~+10 V | +12 V |
| Erase Select | +5 V | +5 V | +5 V | ~+2 V | +5 V |
| Erase Disable | ~0 V | +5 V | +5 V | ~+2 V | +5 V |

| MODE | S12 | S13 | S14 | V10 | V11 |
|---|---|---|---|---|---|
| Read Select | −2 V | −4 V | −2 V | ~0 V | +5 V |
| Read Disable | −2 V | −4 V | −2 V | +5 V | −2 V |
| Program Select | +12 V | −2 V | ~0 V | ~0 V | +12 V |
| Program Disable | +12 V | −2 V | ~0 V | +12 V | ~0 V |
| Erase Select | +5 V | −13 V | −13 V | +5 V | −12 V |
| Erase Disable | +5 V | −13 V | −13 V | ~0 V | +5 V |

As shown in Table II, the preferred embodiment 10 can be characterized as driving the row according to six modes; read select, read deselect, program select, program deselect, erase select, and erase deselect.

In operation, transistor N1 of the preferred embodiment 10 receives the two decode signals X and XIN. XIN is the output of a local decoder and typically selects a group of four to eight row driver circuits when driven low. X selects an individual row from the group determined by XIN, by X going high. With XIN low and X high, N1 pulls node V10 low. As mentioned above, B0 is a current source referenced to S10, and when applied to the gate of P1, limits the amount of current supplied by P1. Thus, unlike the prior art design, current limiting of the PMOS input pull-up transistor is accomplished via B0, as opposed to the comparative geometries of N1 and P1. This enables N1 to be a much smaller device, creating more usable area on the integrated circuit. One skilled in the art would recognize that because B0 is referenced to S10, the current supplied by P1 is limited over the entire range of the positive supply voltage (+5 volts and +12 volts in the preferred embodiment 10).

Referring once again to FIG. 2, is it shown that unlike prior art designs, the output of the level shifter 14 (node V 10) is coupled only to the gate of P2, eliminating the need for a connection to a pull-down device (such as the complementary NMOS transistor in the prior art). This arrangement reduces the required interconnect for the driver circuit 10.

As illustrated in FIG. 2, the output of the level shifter 14 is fed via o node V 10 to the gate P2. When V 10 is pulled low, P2 pulls the row up to the voltage at S10, as is set forth in Table II.

Figure 3:
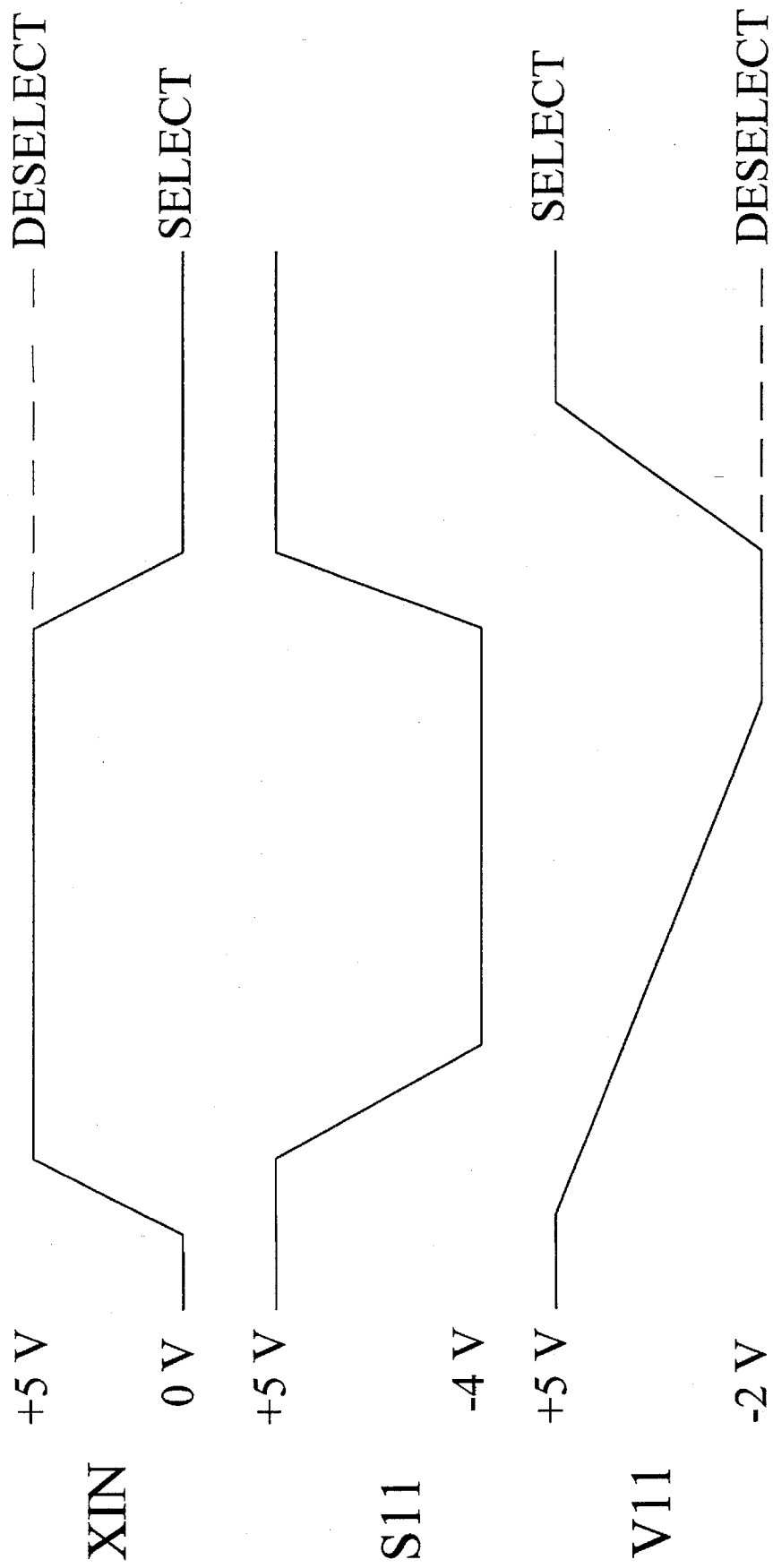
FIG. 3 is a timing diagram illustrating the READ select, and deselect operation of the preferred embodiment.

The present invention 10 departs from the prior art by eliminating an NMOS pull-down transistor. Instead, P3 and P4 operate to pull-down the row as required. As shown in FIG. 2, P3 is connected by its source to the row (V 11). The gate of P3 receives a gate voltage from S11 and the drain receives a variable voltage from S12. In the preferred embodiment, P3 plays an important role during read operations. During a READ operation S12 is at −2 volts and S11 is held at +5 volts. During a row address transition, all rows are deselected by driving their respective XIN inputs high. At the same time, S11 is pulsed to −4 volts, pulling the row to S21, which is at −2 volts, deselecting the row. As is best shown in FIG. 3, at the end of the S11 pulse, S11 is returned to +5 volts for selected rows, or can remain at −4 volts, maintaining rows in the deselected state of −2 volts during the READ. It is noted that unlike deselected READ voltages of ~0 volts, holding deselected rows at −2 volts during read operations allows for lower erase thresholds in the flash cells.

As set forth in Table II, during PROGRAM and ERASE operations, S11 and S12 are both pulled up to the present supply voltage determined by S10, cutting off P3. During the PROGRAM operation, this allows a program voltage (+12 volts) to be applied via P2 to the row if selected, or alternatively, if the row is deselected, the row is pulled down to a program deselect voltage (~0 volts) via transistor P4. In a similar manner, when P3 is cut off during the ERASE operation, a negative erase voltage can be applied via P4 if the gate is selected, and if deselected, the gate is pulled up to S10 by P2. The comparative geometries between P2 and P4 are such that when P2 is on it can source enough current to drive the row (V11) while P4 continues to leak current.

One skilled in art would recognize that the connection to S 11 can run across all the row drivers in a sector on given device, as such, the preferred embodiment 10 requires one less wire channel, enabling the row pitch to be reduced. An even greater advantage of P3 is that it eliminates the need for an NMOS row pull-down transistor. This provides for a simpler row driving circuit layout, and creates more usable space on integrated circuit.

In the preferred embodiment 10, a negative erase voltage for erasing EPROM cells is provided to the row by the P4. P4 is connected by its source to the row (V11). As shown in FIG. 2, the gate of P4 is connected to S13 and the drain is connected to S14. As shown in Table II, in the preferred embodiment 10, during ERASE operations both S13 and S14 provide −13 volts. If the row is selected for erase by both XIN and X going high, V10 is pulled high by P1, cutting off P2. As described previously, P3 is also cut off. This allows P4 to pull down the row to −12 volts. If the row is deselected from erase, N1 is turned on, pulling V10 low, which turns on P2, pulling the erase deselected row to +5 volts.

P4 also plays an important role in the READ and PROGRAM operations. In READ mode, S14 is brought to −2 volts and S13 is brought to −4 volts. This forces P4 into a linear mode of operation, and act as a leaker transistor to help keeping deselected rows at −2 volts. In a similar fashion, during PROGRAM operations, −2 volts is provided by S13 at the gate of P4, and ~0 volts is provided by S14 at its drain. This helps to maintain deselected rows at ~0 volts. It is noted that unlike prior art designs, the gate and drain of P4 are separate nodes. One skilled in the art would recognize that it is easier to supply −2 volts to S14 which draws dc current, and −4 volts to S13, which draws no dc current. Also, by pumping S13 and S14 separately, the deselect voltage can be modified for different modes of operation, such as in the PROGRAM operation, as described above.

Various modifications may be made to the invention without altering its value or scope. Just one example would be to provide a simpler circuit by eliminating the level shifter 14. If the positive supply voltage is substantially equal to or lower than the high level of the input from the decoder, then the gate of P2 can be driven directly by the decoder output.

The row driving circuit of the present invention it not limited to flash EPROM devices. One of the many possible variations could be a row driving circuit for conventional EEPROMs, static random access memories (SRAMs), and/ or dynamic random access memories (DRAMs). Such a variation would employ the program transistor as a leaker transistor only, to assist in pulling the row down during deselect operations. As in the preferred embodiment 10, the need for an NMOS row pull-down device is eliminated, and varying deselect voltages, including negative voltages, can be provided as set forth in the preferred embodiment 10.

All of the above are only some of the examples of the available embodiments of the present invention. Those skilled in the art would readily observe that numerous other modifications and alterations may be made without departing from the spirit and scope of the invention. Accordingly, the above disclosure is not intended to be limiting and the appended claims are to be interpreted as encompassing the entire scope of the invention.

INDUSTRIAL APPLICABILITY

While the predominant intended usage of the row driving circuit of the present invention is for flash EPROM memories, the invention may be used in any application wherein memory rows must be selected and deselected. As mentioned above the row driving circuit could also be used in SRAMs, DRAMs or conventional EEPROMs. The main areas of improvement are in the reduction of layout size and complexity, increased flexibility in the levels of applied voltages in the three modes of operation, and compatibility with simpler manufacturing processes.

Since the row driving circuit for flash EPROMs of the present invention may be readily implemented with existing processes, it is expected that they will be acceptable in the industry as substitutes for the conventional row driving circuits. For these and other reasons, it is expected that the utility and industrial applicability of the invention will be both significant in scope and long-lasting in duration.

What I claim is:

1. In an integrated circuit having at least one row of memory cells, a row driving circuit for selecting and deselecting a row, comprising:

row pull-up driver means responsive to a row select signal for pulling a selected row to a positive supply voltage during a READ mode; and row disable means responsive to a row deselect signal pulling a deselected row to a negative read deselect voltage during the READ mode.

2. The row driving circuit of claim 1 further including:

said row disable means is a PMOS row disable transistor having its source coupled to the row.

3. The row driving circuit of claim 2 further including:

first drain switching means for providing the positive supply voltage for a PROGRAM and ERASE mode, and for providing a negative read deselect voltage during the READ modes;

first gate switching means for providing the positive supply voltage and for pulsing to a negative enable voltage in response to a read deselect signal, the negative enable voltage being lower than the negative read deselect voltage; and the drain of the PMOS row disable transistor is coupled to said first drain switching means, and the gate of the PMOS row disable transistor is coupled to the first gate switching means.

4. The row driving circuit of claim 1 further including:

level shifting means responsive to row decoder signals for providing the row select signal to said row pull-up driver means.

5. The row driving circuit of claim 4 wherein:

said level shifting means includes
an NMOS transistor for receiving the row decoder signals; and
a PMOS input pull-up transistor with its drain coupled to the drain of the NMOS transistor and said row pull-up driver means, its source coupled to the positive supply voltage.

6. The row driving circuit of claim 5 wherein:

the gate of the PMOS input pull-up transistor is coupled to a voltage referenced to the positive supply voltage.

7. The row driving circuit of claim 1 further including:

leaker means coupled to the row for pulling the row down to a deselect voltage.

8. The row driving circuit of claim 7 wherein:

said leaker means is a PMOS leaker transistor with its source coupled to the row.

9. The row driving circuit of claim 8 further including:

second drain switching means for providing a leaker voltage during a READ mode;

second gate switching means for providing a leaker bias voltage during the READ mode; and the drain of the PMOS leaker transistor is coupled to said second drain switching means, and the gate of the PMOS leaker transistor is coupled to said second gate switching means.

10. The row driving circuit of claim 9 wherein:

said second drain switching means further provides a negative erase voltage during an ERASE mode; and said second gate switching means further provides a negative erase voltage during the ERASE mode.

11. The row driving circuit of claim 10 wherein:

said second drain switching further provides a program deselect voltage during a PROGRAM mode; and said second gate switching further provides a program deselect bias voltage during the PROGRAM mode.

12. The row driving circuit of claim 10 wherein:

the geometries of the PMOS leaker transistor allow said row pull-up driver means to source more current than the PMOS leaker transistor can sink.

13. A row driving circuit for driving a row in a memory array, comprising:

a PMOS pull-up driver circuit coupled to the row and responsive to a select signal for pulling the row up to a positive supply voltage, said PMOS pull-up driver circuit including a PMOS pull-up transistor having its source coupled to the positive power supply, its drain coupled to the row, and its gate receiving a row select signal;

control signal means for providing a positive control signal when the row is selected, and a negative control signal when the row is deselected, the negative control signal being lower than the deselect voltage; and a PMOS pull-down driver circuit coupled to the row for pulling the row to a deselect voltage, said PMOS pull-down driver circuit including a PMOS pull-down transistor having its source coupled to the row, its drain selectively coupled to a deselect voltage, and its gate coupled to said control signal means.

14. A row driving circuit for driving a row in a memory array, comprising:

PMOS pull-up driver circuit coupled to the row, responsive to a select signal for pulling the row up to a positive supply voltage;

PMOS pull-down driver circuit coupled to the row for pulling the row to a deselect voltage;

leaker bias means for providing a leaker biasing voltage; and said pull-down driver circuit includes a PMOS leaker transistor having its source coupled to the row, its drain selectively coupled to the deselect voltage;

wherein the W/L ratio of the leaker transistor enables the PMOS pull-up driver circuit to pull up the row as the leaker transistor sinks current.

15. The row driving circuit of claim 14 further including:

leaker drain voltage means for providing a variable drain voltage including the deselect voltage;

the leaker biasing voltage of said leaker bias means is less than the variable drain voltage; and the drain of the leaker transistor is coupled to said leaker drain voltage means.

16. In a row driving circuit having an NMOS passgate input transistor for receiving row select signals, a PMOS input pull-up transistor drain coupled to the NMOS transistor, a PMOS row pull-up transistor coupled by its gate to the drains of the NMOS passgate and the PMOS input pull-up transistors, by its source to a variable positive supply voltage, and by its drain to the row, and a PMOS erase transistor that is source coupled to the row, the improvement comprising:

a PMOS pull down transistor having its source connected to the row its drain connected to a first switchable voltage source, and its gate connected to a second switchable voltage source.

17. The improvement of claim 16 further including:

connecting the gate of the PMOS erase transistor to a third switchable voltage source, and the drain to a fourth switchable voltage source.

18. The improvement of claim 16 further including:

biasing means referenced to the variable positive power supply voltage for providing a bias voltage to the gate of the PMOS input pull-up transistor, the bias voltage limiting the amount of current sourced by the PMOS input pull-up transistor.

* * * * *